United States Patent [19]

Ammon

[11] 4,054,939
[45] Oct. 18, 1977

[54] MULTI-LAYER BACKPANEL INCLUDING METAL PLATE GROUND AND VOLTAGE PLANES

[75] Inventor: J. Preston Ammon, Dallas, Tex.

[73] Assignee: Elfab Corporation, Dallas, Tex.

[21] Appl. No.: 584,264

[22] Filed: June 6, 1975

[51] Int. Cl.² ............................................. H02B 1/02
[52] U.S. Cl. ...................................... 361/414; 29/625
[58] Field of Search ............... 317/101 CM; 174/68.5; 29/625, 624, 626; 427/97; 361/414; 339/176 MP, 17 M, 17 LM, 17 LC

[56] References Cited

U.S. PATENT DOCUMENTS

| | | | |
|---|---|---|---|
| 3,334,395 | 8/1967 | Cook et al. | 29/625 |
| 3,354,542 | 11/1967 | Mallia | 29/625 |
| 3,509,268 | 4/1970 | Schwartz et al. | 174/68.5 |
| 3,514,538 | 5/1970 | Chadwick et al. | 29/625 |
| 3,660,726 | 5/1972 | Ammon et al. | 317/101 CM |
| 3,663,866 | 5/1972 | Iosue et al. | 317/101 CM |
| 3,932,932 | 1/1976 | Goodman | 174/68.5 |

Primary Examiner—David Smith, Jr.
Attorney, Agent, or Firm—Crisman & Moore

[57] ABSTRACT

A metal voltage plate is drilled or punched first with alignment holes, placed upon a jig and drilled with contact clearance holes in preselected locations. A metal ground plate is also drilled or punched first with alignment holes, placed upon a jig and drilled with contact clearance holes in preselected locations. The clearance holes are preferably in the range of 80–90 mils in diameter and located in positions where contacts are to pass through a plate without making electrical connection therewith. Next, both the voltage and ground plates are coated, including the inner walls of the clearance holes, with a relatively thick layer of an insulative dielectric material, such as teflon, polyurethane, p.v.c., or the like. The coated voltage plate is then drilled or punched with an array of smaller connecting holes, on the order of 40 mils in diameter, through which contacts to be electrically connected with voltage will be pressed. Since the connecting holes are made after the plate has been coated with a dielectric, the insides of the connecting holes will comprise bare metal and, hence, make good electrical connection with a contact portion press fitted therein. The coated ground plate is similarly drilled or punched with an array of smaller connecting holes, also on the order of 40 mils in diameter, through which contacts to be electrically connected with ground potential will be pressed. Each connecting hole in the ground plate is in a different location, with respect to the alignment holes, than each connecting hole in the voltage plate.

A pair of double-sided, glass-filled, epoxy resin printed circuit boards, with alignment holes corresponding to those in the metal plates, are placed one above and one below the pair of adjacent metal plates. The printed circuit boards include plated-through holes in each location where a contact is to be fitted and each corresponds to a connecting hole in either the ground or voltage plate or a clearance hole in either or both. When a contact is press fitted down through the axially aligned holes in the stacked layers, frictional engagement of the contacts with the plated walls of the holes in the top and the bottom printed circuit boards, as well as the connecting holes in the metal plates, mechanically joins the layers into a single unitary structure and electrically interconnects each point which is in interfering engagement with the contact.

39 Claims, 19 Drawing Figures

MULTI-LAYER BACKPANEL INCLUDING METAL PLATE GROUND AND VOLTAGE PLANES

BACKGROUND OF THE INVENTION

1. Field of the Invention

The invention relates to the manufacture of multi-layer printed circuit boards and, more particularly, to a multi-layer printed circuit board having ground and voltage distribution plates formed integrally therein. The invention includes a structure and a method for manufacturing a multi-layer printed circuit board from a stack of single layer printed circuit boards and ground and voltage distribution plates.

2. History of the Prior Art

In the past, one technique for manufacturing multi-layer printed circuit boards includes sandwiching an insulating sheet between a plurality of single layer printed circuit boards. Each of the single layer boards includes enlarged pad areas thereon which are in spaced alignment with one another. An adhesive is placed between each one of the individual layers and then the boards are temperature and pressure laminated together to form a single, unitary, multi-layer printed circuit board. After lamination, the pad areas on the board are drilled through and the material forming the insulative board is then etched back from the hole to ensure all copper layers extend out into the hole so that subsequent plating makes electrical connection with all layers. The drilled hole is then plated through all the layers of the board to electrically interconnect the printed circuitry formed on each one of the individual layers.

An improvement in the prior art of temperature/pressure laminated multi-layer printed circuit boards is shown and claimed in U.S. Pat. No. 3,660,726 issued May 2, 1972 and assigned to the assignee of the present invention. In general, the aforementioned patent involves a technique for forming a multi-layer board by stacking a plurality of single layer printed circuit boards separated by insulative sheets, so that a plurality of plated through holes in each of the boards are axially aligned. An electrical contact, such as that used in a printed circuit card edge connector, is press fitted down through each of the aligned plated through holes. Frictional engagement of the contacts with the plated walls of the holes mechanically joins the boards into a single unitary structure and connects each one of the axially aligned conductive holes to form an electrical interconnection between the circuitry printed upon each one of the boards which is connected to a plated hole.

When printed circuit card edge connectors, such as shown in U.S. Pat. No. 3,671,917, are arrayed on a backpanel (motherboard) to receive and connect component bearing printed circuit cards (daughterboards), each contact is either unused, connected to ground potential, connected to a power supply voltage potential, or isolated from both supply voltages and grounds to carry a varying signal voltage.

Today, most of the active components mounted on daughterboards are semiconductive in nature and, hence, require relatively low power supply voltages, e.g., on the order of 2 volts above ground. However, because of the large number of such components associated with each backpanel the power supply distribution current requirements become quite large, e.g., on the order of 50–300 amps. When, for certain applications, very large currents are distributed through the printed conductive traces of an epoxy motherboard, undesirable effects may result due to the normally negligible resistance of the printed traces. For example, if there is a need to deliver a current of 300 amps at a power supply voltage of 2 volts through printed circuit board traces having a resistance of, typically, one milliohm, a voltage drop will occur in accordance with the formula: $V = IR$; which yields a drop of 0.30 volts. This 15% decrease in power supply voltage is an unacceptable design practice for providing a supply voltage which will reliably power the components on the daughterboard. Of course, anytime a conductor is carrying a substantial amount of current there is resistance heating and the conductor must be able to carry the required current without burning up.

Prior to the development of glass-filled epoxy printed circuit interconnecting backpanels, discrete connectors were often mounted on a relatively thick 50–60 mils metal current distribution plate. This was sometimes done by drilling rows of enlarged apertures in the plate to receive the contact tails extending from each discrete connector. Prior to placing a connector in position on a metal voltage plate, each contact tail was threaded onto either a conductive hub, if the particular contact was to electrically interconnect with the metal plate voltage; or insulative hub, if the particular contact was to be a ground or signal contact. Although such metal plate backpanel systems could distribute large amounts of current through the plate with very little IR drop, each interconnection between signal contacts had to be individually wired, a technique much more expensive and less reliable than printed circuit interconnecting backpanels. Prior art metal plate systems have inherently had a certain amount of contact resistance loss since each contact to be electrically connected to a plate is first inserted into a metal hub, introducing a certain amount of surface contact resistance, and then the hub is inserted into a hole in the plate, introducing additional contact resistance. In the present invention, contact resistance is lowered by press fitting contacts directly into bare metal holes in the current carrying plate. The present invention is concerned generally with incorporating the current carrying abilities of a metal plate system into a multi-layer printed circuit assembly.

SUMMARY OF THE INVENTION

A multi-layer assembly and method of manufacture in which at least one printed circuit board and at least one metal current carrying metal plate, all having aligned holes therein, are selectively interconnected with one another and bonded together by contacts press fitted through the aligned holes. More particularly, the invention involves the resulting product and a method for manufacturing a multi-layer printed circuit board from a plurality of individual printed circuit boards including glass-filled epoxy sheets having a pattern of conductive material upon at least one surface thereof and plated holes in the boards extending through and electrically connected with portions of the conductive patterns. A conductive metal plate having enlarged clearance holes selectively placed therein is coated with a layer of insulative dielectric material and then perforated with smaller selectively placed connecting holes. The boards and the plate are stacked to axially align the desired holes. A conductive contact is press fitted through the aligned plated through holes in the upper and lower printed circuit boards to make electrical contact with the conductive patterns adjacent the holes on the boards and to frictionally engage the walls of the holes to mechanically join the individual boards into a single, unitary multi-layer printed circuit board assembly. Each conductive contact passes through either an insulation coated, enlarged clearance hole in the plate, and is thereby insulated therefrom, or interferingly through a smaller connecting hole having bare metal insides for electrical connection therewith.

BRIEF DESCRIPTION OF THE DRAWINGS

For a more complete understanding of the present invention and for further objects and advantages thereof, reference may now be had to the following description taken in conjunction with the accompanying drawings, in which.

DETAILED DESCRIPTION

Figure 1:
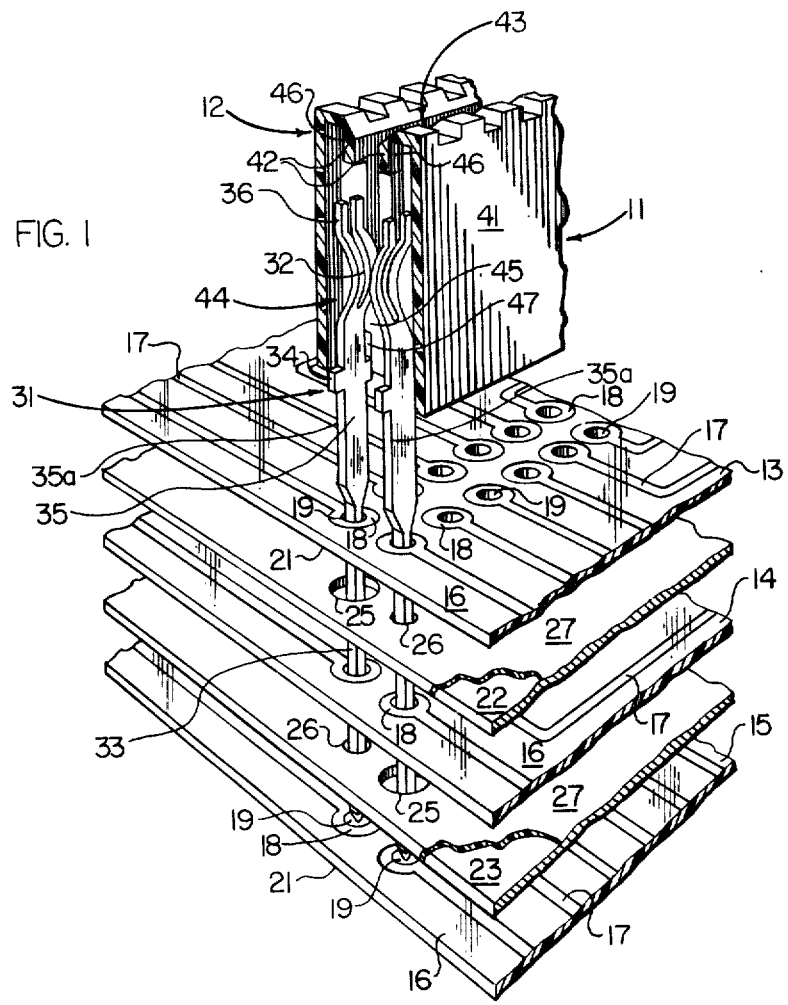
FIG. 1 is an exploded perspective view of one embodiment of a multi-layer printed circuit board assembly having voltage and ground plates therein and constructed in accordance with the present invention.

A present practice in the packaging of complex electronic circuitry is to mount, both active and passive components on printed circuit cards, referred to as daughterboards. Each printed circuit board comprises a sheet of insulative material, such as a glass-filled epoxy resin referred to as G-10 or FR-4, having a pattern of conductive material deposited on either one or both faces thereof. In a double-sided board, interconnections between selected parts of the circuitry on one surface of the board are made with circuitry on the opposite surface by plated-through holes which form electrically continuous paths between the two surfaces. The pattern of conductive material on each board interconnects the various components mounted on the board and provides for external power and signal connections by conductive regions which are spaced from one another along one edge of the board.

Printed circuit board edge connectors are devices which include a plurality of rigidly mounted, laterally spaced, bowed contacts and a means for guiding the board into the connector so that each of the conductive regions spaced along the edge of the board electrically engage one contact. An example of a printed circuit board edge connector is shown in U.S. Pat. No. 3,671,917, assigned to the assignee of the present invention.

In most electronic systems it is necessary to interconnect the circuit patterns on the surfaces of a plurality of different printed circuit boards. With each daughterboard inserted into an edge connector, interconnection can be made by wiring from the tail of each individual connector contact to the tail of each different contact with which the point is to make electrical connection. In such "hard wired" interconnection systems, power can be delivered to the components by mounting the connectors on a current carrying conductive metal backplane and insulating each connector contact to have a wired interconnection from the metal plane.

The current trend in electronic packaging, however, is to mount each of the connectors on a large multi-layer printed circuit board, known as a motherboard or a printed circuit interconnecting backpanel. Vast numbers of the previously hard wired interconnections can be eliminated by forming the signal interconnections between connector contacts as part of the printed pattern on one or more surfaces of multi-layer backpanel. Power connections to the daughterboards can similarly be made, in most instances, by either hard wiring to the proper connector contacts or through the printed circuitry in the motherboard. Such an interconnecting backpanel for card edge connectors is shown and claimed in U.S. Pat. No. 3,660,726.

However, for certain applications where the power requirements are high and the voltage deviation tolerances are low, it is difficult to deliver adequate power to the circuitry through the printed circuitry on the motherboard. One of the objects of the present invention is to incorporate full power delivery capability into a relatively inexpensive multi-layer interconnecting backpanel. Another object of the invention is to incorporate one or more metal plates into a printed circuit board assembly to serve as an r.f. shield for signals carried by printed traces on the circuit boards.

Referring to FIG. 1 there is shown an exploded perspective view of a multi-layer printed circuit board 10 constructed in accordance with one embodiment of the invention and having a card edge connector insulator 11 mounted thereon. The nearer end portion 12 of the insulator 11 has been removed to better illustrate the contact portions within. The multi-layer structure of the present invention comprises a plurality of conventional printed circuit boards 13, 14 and 15 (13-15), which may be either single or double sided. Each of the boards 13-15 include a sheet of insulative material 16, such as a glass-filled epoxy resin known as G-10 or FR-4, having formed thereon a pattern comprising a plurality of conductive pathways 17. Enlarged pads 18 are formed at locations on the boards 13-15 which are designed to electrically connect with other points within the multi-layer array. In a double-sided board, one of the pads 18 surrounds a hole 19 passing through the board and on the opposite side of the hole is a matching pad 21. Each one of the holes 19 surrounded by the pads 18 and 21 is preferably plated with a base layer of a conductive metal, such as a copper alloy, and an outer layer of a material such as a tinlead material so that pads 18 and 21 are joined by a continuous metal layer forming the walls of the plated-through hole. The inside diameter of a plated hole may be typically on the order of about 40 mils in diameter.

Still referring to FIG. 1, each one of the individual boards 13-15 is manufactured as a single printed circuit board and is initially drilled before plating so that the holes in the different boards having pads to be interconnected will be in axial alignment with one another when the boards are stacked in the multi-layer configuration. Registration of the holes may be easily accomplished by drilling all of the boards simultaneously on a jig or by using alignment holes (not shown) and precision drilling equipment so that all the holes in successively drilled boards are accurately positioned.

As shown in FIG. 1, each one of the individual printed circuit boards 13-15 are separated by a current carrying metal plate. Lying between the upper board 13 and the center board 14 is a voltage plate 22 and lying between the center board 14 and the lower board 15 is a ground plate 23. Each of the plates 22 and 23 include alignment holes 24 (FIG. 9), clearance holes 25 and connecting holes 26.

The holes 25 and 26 in the current carrying plates 22 and 23 are preferably drilled or punched using the alignment holes 24 as a reference point. Thus, there is a hole, either a clearance hole 25 or a connecting hole 26, in axial alignment with each of the plated holes 19 in each of the printed circuit boards 13-15.

Each one of the plates 22 and 23 is preferably on the order of 25 mils thick and is first drilled with clearance holes 25 in the desired locations. The drilled plates are then coated with a layer of insulation 27 over all exposed surfaces of the plate, including the inner walls of the clearance holes. The insulative coating 27 may comprise teflon, polyurethane, polyvinylchloride or a like plastic insulator with good dielectric properties, i.e., preferably with a breakdown voltage in excess of 500 volts. The thickness of the coating 27 is preferably in the range of 5-7 mils to ensure good insulation properties. The coating 27 may be applied to the plates by spraying, immersion or any other acceptable means of application that will yield a coating of generally uniform thickness and assure coverage of the inside walls of the clearance holes 25.

After application of the insulative coating 27 to the plates 22 and 23, they are again drilled in preselected locations to produce the connecting holes 26. Connecting holes 26 may be typically on the order of about 40 mils in diameter, i.e., approximately the same as the inside diameter of one of the plated holes 19 in the boards 13-15. Since the connecting holes 26 are drilled after the application of the insulative coating 27 to the plate, the insides of the connecting holes 26 will comprise bare metal.

Many prior art metal backpanels have used aluminum plates; however, in these prior applications contacts were first fitted into hubs or grommets and then the hubs, having vertical serrations therein, inserted into apertures in the panels. For contacts made of standard material, such as a phos-bronze, aluminum has been shown to be too soft for receiving directly press fitted contacts. Moreover, if the metal of the plate used in the present invention is too soft, then a press fitted contact pushes metal out of the receiving hole, and deforms it with little memory; if the metal of the plate is too hard, then the metal of the contact will shear off or be deformed (i.e., coined). For example, it has been found that a material having the characteristics of annealed nickel silver or annealed cupro-nickel CDA 725 with a Rockwell Hardness of about 85 on the F scale works satisfactorily as a material for forming the plates 22 and 23 when used with standard phos-bronze contacts.

Figure 2:
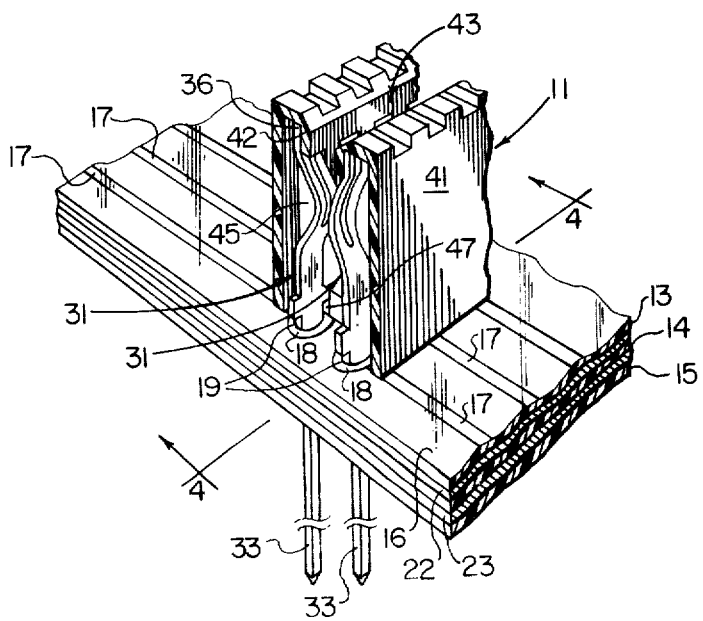
FIG. 2 is a perspective view of the assembled multi-layer printed circuit board shown in FIG. 1.

As the boards and plates, shown exploded in FIG. 2, are brought together into a stack, the plated-through holes 19 in the pads 18 and 21 on each of the boards 13-15 are in axial alignment with one another and with either a clearance hole 25 or a connecting hole 26 in each of the metal plates 22 and 23. It should be understood that certain ones of the holes 19 in the individual single layer boards 13-15 may not be aligned with holes on any other boards or plates but be buried within the stack and serve only to interconnect circuitry from the upper to the lower surface of that one board.

When the boards 13-15 and the metal plates 22 and 23 are stacked together with proper holes in the various elements in axial alignment, conductive metal contacts 31 are press fitted down through the axially aligned holes. Each metal contact 31 comprises a bowed connector portion 32 and a tail portion 33 which are separated by a shoulder 34 and an enlarged shank section 35 which is greater in width than the tail. A flange portion 36 is located at the upper end of each contact. The plated-through holes 19 in the boards 13-15 and the connecting holes 26 in the plates 22 and 23 are slightly larger than the tail portion 33 so that a contact 31 will pass readily into the holes. The shank section 35 is slightly larger than the diameter of the holes 19 and 26, which may typically be on the order of 40 mils in diameter, so that when a contact is press fitted down into the holes there is a snug frictional engagement between the edges 35a of the shank section and the metal interior of the holes 19 and 26. In the contact embodiment shown, the rectangular cross-section may be typically on the order of 25 mils by 40 mils, producing a diagonal dimension of about 44 mils. Because of the size difference between the shank section 35 and the inner walls of the holes 19 and 26, the material is deformed away from the angular edges 35a to form a tight fit between the contiguous parts. Each of the contacts 31 shown in FIG. 1 include shank sections 35 having a rectangular cross-section defining four angular edges 35a. The tail portion 33 of each contact 31 is substantially square in cross-section as is required to permit wiring termination by such techniques as wire wrapping.

The embodiment of the present invention shown in FIG. 1 is illustrated as an interconnecting backpanel for a printed circuit card edge connector such as is shown in U.S. Pat. No. 3,671,917. It should be understood that the contacts used in the present invention could be those protruding from the bottom of a discrete connector, as long as the press fitting shank portions thereof were long enough. Moreover, an interfering square post contact without a connecting portion on either end could be used in forming the assembly of the present invention.

Once the contacts 31 are fully inserted into the stack of boards and panels (as shown in FIG. 2) the insulative housing 11 is placed over the protruding connecting portions 32. The housing 11 is preferably formed of a moldable insulative material such as nylon or other plastic and includes an outer shell 41 which is open at its bottom portion to allow the shell to fit down over and receive the contacts 31. The shell 41 is partially closed at the top by two U-shaped edge sections 42 at the upper portion to define a top opening 43 through which a printed circuit daughterboard edge can be inserted to engage the contacts 31. The housing 11 is preferably divided into a plurality of contact pair receiving chambers 44 by transverse wall sections 45. Each of the chambers 44 preferably receives a pair of contacts 31 when the housing 11 is placed down over the contacts. The housing 11 may be held in position by frictional engagement between certain contact shoulders 34 and a slot 47 in certain of the transverse walls 45. An overhanging lip portion 46 is formed on the innermost part of the U-shaped edge sections 42 to contact the flanges 36 and preload each of the contacts 31.

It should, of course, be apparent that the multi-layer printed circuit board of the present invention could be made with contacts having a different upper portion than the card edge contacts shown herein, and further, if other types card edge contacts are used, insulative housings of different types could be employed. Further, any contacts used could have the tail portion removed either before or after press fitting.

Referring back again to FIG. 1, only one pair of contacts 31 are shown for illustrative purposes but, of course, a plurality of pairs of contacts would be installed, one in each of the plated holes 19 in the upper printed circuit board 13. Contacts are preferably installed in rows in accordance with the teachings of U.S. Pat. No. 3,676,926, assigned to the assignee of the present invention.

When the boards 13-15 and the metal plates 22 and 23 are brought into an aligned stack and the contacts 31 are press fitted down through the aligned apertures 19, 25 and 26, the frictional engagement between the contact shank 35 and the insides of the plates holes 19 in the upper and lower boards 13 and 15 will mechanically join the individual layers into a single, unitary multi-layer printed circuit board. For this reason it is preferred to use printed circuit board material on the order of at least 1/32 inch or 1/16 inch of one inch thick for the top and bottom boards 13 and 15. To a certain extent, the frictional engagement of the contact shank 35 with the inner walls of the connecting holes 26 will also assist in mechanically joining the layers into a single unitary structure. The metallic inner walls of each of the plated holes 19 and the connecting holes 26 through which an individual contact is press fitted will be electrically interconnected with one another so that the potential thereof will be the same as that of the plate through which the connecting hole 26 is formed. Each contact will be electrically isolated from a clearance hole 25 in a plate through which the contact passes by both an air gap, due to the larger size of the clearance hole, e.g., on the order of about 85 mils, and by the several mil thick insulative coating 27 on the interior of each clearance hole 25. Similarly, each of the plates 22 and 23 are electrically isolated from the circuitry patterns 17 on any printed circuit board surface lying adjacent the plate by the coating of insulation previously placed thereon as described above.

During assembly of the structure shown in FIG. 1, the shank portion 35 of the left contact passes interferingly through a plated hole 19 in the top board 13; passes with clearance through the clearance hole 25 in the plate 22; and passes interferingly through the plated hole 19 in the center board 14, the connecting hole 26 in the plate 23 and the plated hole 19 in the bottom board 15. Thus, all points in conductive contact with the plated holes 19, through which the left contact extends, will be at the same electrical potential as that of the plate 23 and electrically isolated from the potential of plate 22.

Similarly, during assembly, the shank portion 35 of the right contact passes interferingly through the plate hole 19 in the top board, the connecting hole 26 in the plate 22, the plated hole 19 in the center board 14; passes with clearance through the clearance hole 25 in the plate 23; and passes interferingly through the plated hole 19 in the bottom board 15. Thus, all points in conductive contact with the plated holes 19, through which the right contact extends, will be at the same electrical potential as that of the plate 22 and electrically isolated from the potential of the plate 23.

Either the left or the right contact could be modified into a variable signal carrying contact by converting both of the holes in the metal plates 22 and 23, through which the contact passes, into clearance holes. Thus, only the plated holes 19 through which the contact interferingly passed would be electrically interconnected.

FIG. 2 shows the multi-layer structure of FIG. 1 after a plurality of pairs of the contacts 31 have been fully press fitted into each of the aligned holes in the stack of layers and the insulative housing 11 has been laid over to form a printed circuit card edge connector system.

Figure 3:
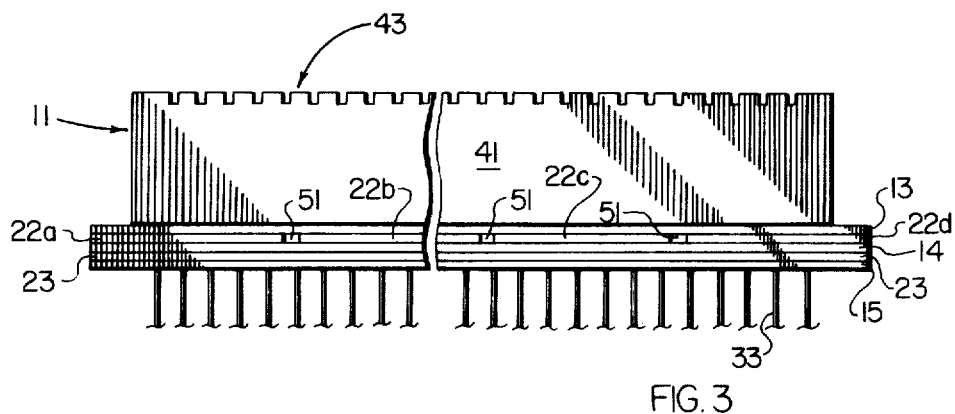
FIG. 3 is a fragmentary side view of the multi-layer printed circuit board assembly of FIG. 2, illustrating four different voltage plates in a single composite multi-layer board constructed in accordance with one aspect of the invention.

Assuming for the moment that the potential of the metal current carrying plate 23 is fixed at ground (by external power supply connections not shown), then the potential of the other plate 22 would be fixed at some different power supply voltage Vcc. In this connection, another aspect of the invention is shown in FIG. 3. There a side view illustrates a single continuous ground potential plate 23 into which any contacts to be supplied with Gnd are connected by connecting hole as described above. However, FIG. 3 shows that, instead of a single continuous voltage plate 22 held at Vcc, the plate may comprise strips 22a, 22b, 22c and 22d which are electrically isolated from one another by means of both the insulative coating on each and an air gap 51 located between adjacent ones of the strips. Thus, the multi-layer assembly of the present invention provides for a number of different power supply voltages Vcc1, Vcc2, Vcc3 and Vcc4 (one associated with each one of the strips 22a-22d) being available to each connector.

Figures 4A, 4B, 4C:
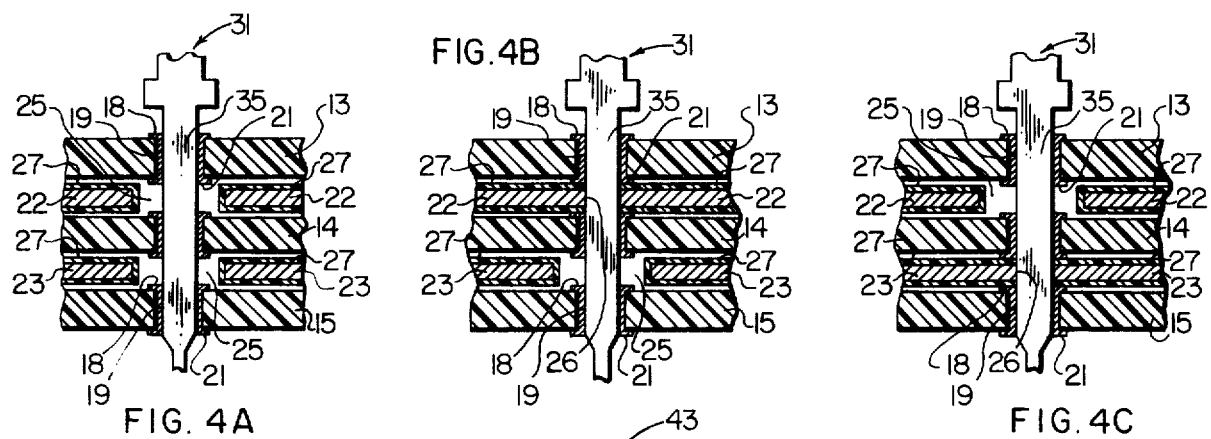
FIGS. 4A, 4B and 4C are fragmentary cross-section views taken at different locations along line 4—4 of FIG. 2 in order to illustrate different interconnection relationships between a contact, the printed circuit boards and the voltage and ground plates.

FIGS. 4A, 4B and 4C are cross-section views each illustrating a possible interconnection pattern between a contact shank 35 and the different components of the multi-layer structure of FIG. 1. FIG. 4A shows a signal contact shank 35 passing interferingly through three aligned plated holes 19 in the boards 13-15 and being isolated from a fixed potential by passing through clearance holes 25 in each of the plates 22 and 23. Again assuming that the plate 22 is fixed at a voltage Vcc, and the plate 23 is fixed at a ground potential Gnd, FIG. 4B shows a voltage contact shank 35 passing interferingly through three aligned plated holes 19 in the boards 13–15; being connected to Vcc by passing interferingly through a connecting hole 26 in the voltage plate 22; and being isolated from Gnd by passing through the clearance hole 25 in the ground plate 23. Similarly, FIG. 4C shows a ground contact shank 35 passing interferingly through three aligned plated holes 19 in the boards 13–15; being isolated from Vcc by passing through the clearance hole 25 in the voltage plate 22; and being connected by Gnd by passing interferingly through the connecting hole 26 in the ground plate 23.

Figure 5:
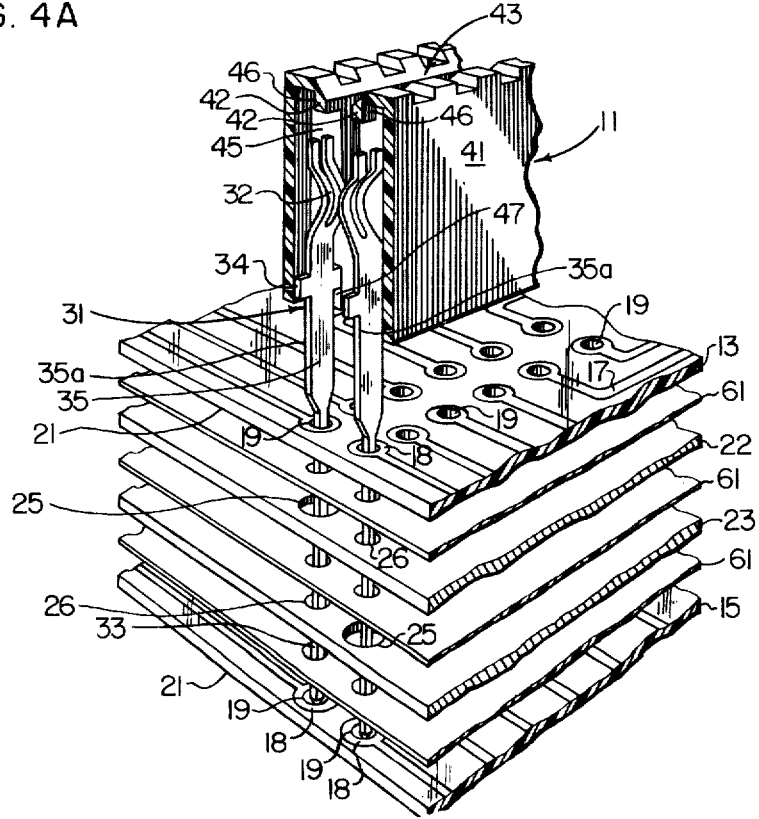
FIG. 5 is an exploded perspective view of another embodiment of a multi-layer printed circuit board assembly having voltage and ground plates therein and constructed in accordance with the invention.

FIG. 5 shows an exploded perspective view of a different embodiment of the invention. Identical numbers have been used for parts which correspond to those previously numbered and described above in connection with FIG. 1. FIG. 5 shows a stack of elements including a top printed circuit board 13 having patterns of conductive areas 17 printed thereon. Also shown are a pair of rows of plated-through holes 19 each one of which is surrounded on one surface by an upper pad 18 and on the other surface by a lower pad 21. Pairs of contacts 31, identical to the one illustrated, are inserted into each of the pairs of plated-through holes 19 shown in the top printed circuit board 13. Between the top printed circuit board 13 and the bottom printed circuit board 15, there are located a pair of current carrying metal plates 22 and 23. Each of the plates 22 and 23 is drilled in certain locations with clearance holes 25, on the order of about 85 mils in diameter, and in other locations with connecting holes 26, on the order of about 40 mils in diameter. Adjacent to each surface of each of the metal plates 22 and 23 there is located a sheet of insulative material 61, such as "MYLAR" polyester film, preferably in the range of 3–7 mils in thickness.

Figure 6:
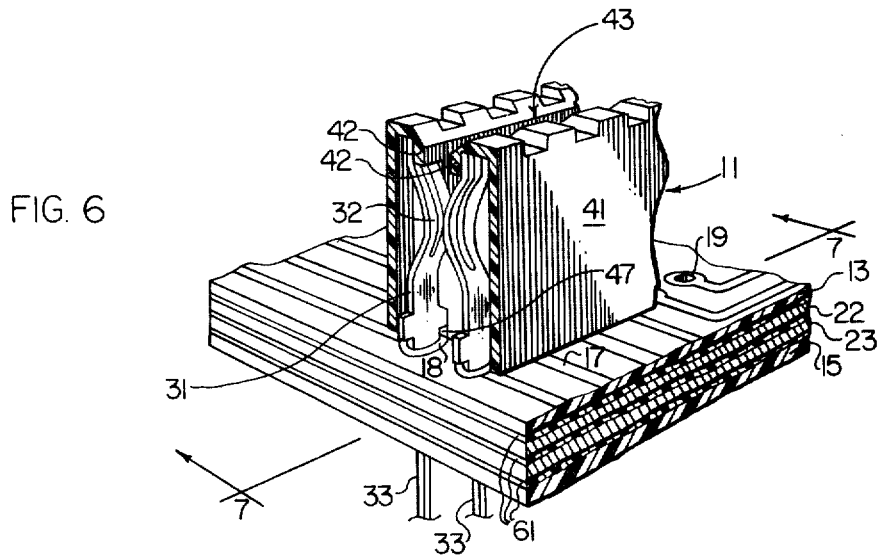
FIG. 6 is a perspective view of the multi-layer printed circuit board assembly of FIG. 5.

When all of the contacts 31 have been press fitted down through aligned apertures in the printed circuit boards 13 and 15 and the plates 22 and 23, and an insulative housing 11 laid over, the finished assembly will appear as illustrated in FIG. 6. Each contact shank portion 35 will be in electrical contact with either one or neither of the metal plates 22 and 23. Each one of the plates 22 and 23 will be electrically isolated from one another and from conductive circuitry 17 on a contiguous printed circuit board by the interleaved sheets of insulative material 61. Each contact shank portion 35 which passes through a clearance hole 25 in a metal plate will be isolated therefrom by the air gap between the inner surface of the clearance hole through the metal plate.

Figure 7A:
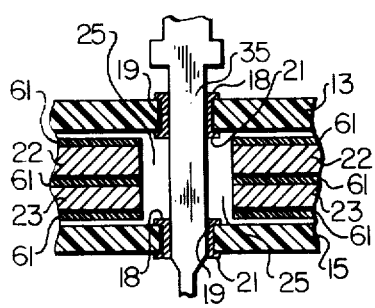
FIGS. 7A, 7B and 7C are fragmentary cross-section views taken at different locations along line 7—7 of FIG. 6 in order to illustrate different interconnection relationships between a contact, the printed circuit boards and the voltage and ground plates.
Figure 7B:
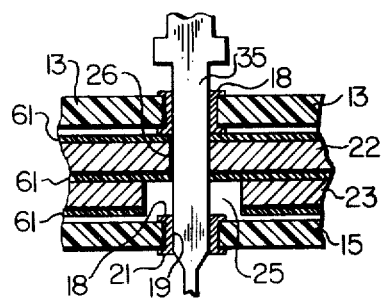
Figure 7C:
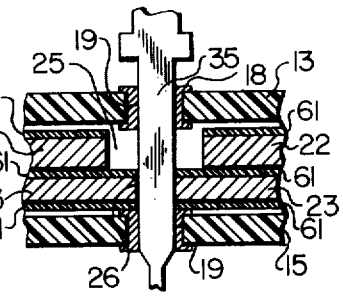

For example, and again assuming plate 22 is a voltage plane and plate 23 is a ground plane, FIGS. 7A, 7B and 7C are cross-section views each illustrating a possible interconnection pattern between a contact shank 35 and the different components of the multi-layer structure of FIG. 1. FIG. 7A shows a signal contact shank 35 passing interferingly through two aligned plated holes 19 in the boards 13 and 15 and being isolated from both ground and voltage potentials by passing through clearance holes 25 in each of the plates 22 and 23. FIG. 7B shows a voltage contact shank 35 passing interferingly through the two aligned plated holes 19 in the boards 13 and 15; being connected to a Vcc by passing interferingly through a connecting hole 26 in the voltage plate 22; and being isolated from Gnd by passing through the clearance hole 25 in the ground potential plate 23. FIG. 7C shows a ground contact shank 35 passing interferingly through the two plated holes in the boards 13 and 15; being isolated from Vcc by passing through the clearance hole 25 in the voltage plate 22; and being connected to Gnd by passing interferingly through the connecting hole in the ground plate 23.

Returning again to the preferred embodiment of the invention shown in FIGS. 1–4, it will be seen that there is shown a multi-layer structure comprising three printed circuit boards 13, 14 and 15 and two metal plates 22 and 23, i.e., the two metal plates 22 and 23 are separated by the center printed circuit board 14. It should be noted, however, that the system of the invention will operate properly in a two-printed circuit board/two-metal plate configuration. That is, the insulative coating 27 applied to both of the metal plates 22 and 23 will allow them to be positioned adjacent one another with their contiguous surfaces in contact.

Figure 8A:
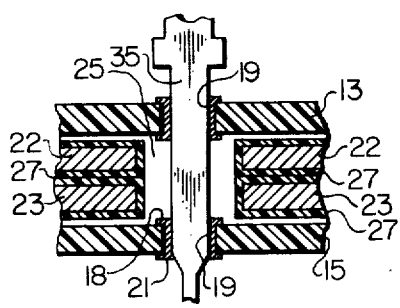
FIGS. 8A, 8B and 8C are illustrative fragmentary cross-section views illustrating different interconnection relationships between a contact, the printed circuit boards and the voltage and ground plates in a two-board system of the same embodiment of the invention as shown in FIGS. 4A-4C with a three-board system.
Figure 8B:
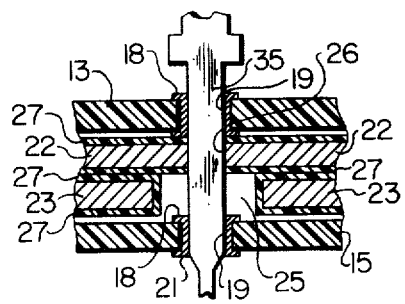
Figure 8C:
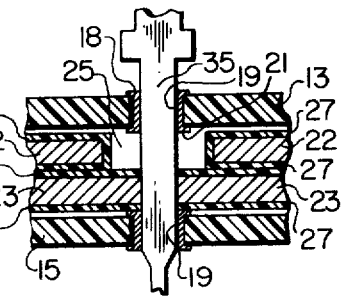

FIGS. 8A–8C, is analogous to FIGS. 4A–4C, and are shown merely to illustrate the possible interconnection patterns between a contact shank 35 and the different components of a two board/two plate system of the type shown in FIGS. 1–4. If we again assume that the upper plate 22 is a voltage plane and the lower plate 23 is a ground plane, FIG. 8A represents a signal contact shank 35 passing interferingly through the two plate holes 19 in the boards 13 and 15 and being isolated from a fixed potential by passing through the clearance holes 25 in the plates 22 and 23. The two metal plates 22 and 23 are isolated from one another by the insulative dielectric coatings 27 on each one of the plates. FIG. 8B represents a voltage contact shank 35 passing interferingly through the two aligned plated holes 19 in the top and bottom boards 13 and 15; being connected to Vcc by passing interferingly through a connecting hole 26 in the voltage plate 22; and being isolated from Gnd by passing through the clearance hole 25 in the ground plate 23. FIG. 8C represents a ground contact shank 35 passing interferingly through the two plated holes 19 in the top and bottom boards 13 and 15; being isolated from Vcc by passing through the clearance hole 25 in the voltage plate 22; and being connected to Gnd by passing interferingly through the connecting hole 26 in the ground plate 23.

Figure 9:
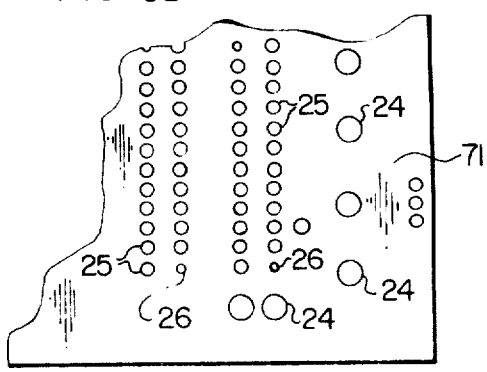
FIG. 9 is a fragmentary top plan view of a current distribution plate employed in the present invention illustrating alignment holes, clearance holes and connecting holes therein.

FIG. 9 is a fragmentary top plan view of one of the metal current carrying plates 71 used in connection with the invention. FIG. 9 illustrates the use of three different type holes in the plate 71, i.e., alignment and registration holes 24, clearance holes 25 and connecting holes 26. It should also be noted that the connecting holes 26 will act as alignment holes and serve to hold the plates in proper alignment with the printed circuit boards after contacts have been press fitted therein.

Figure 10:
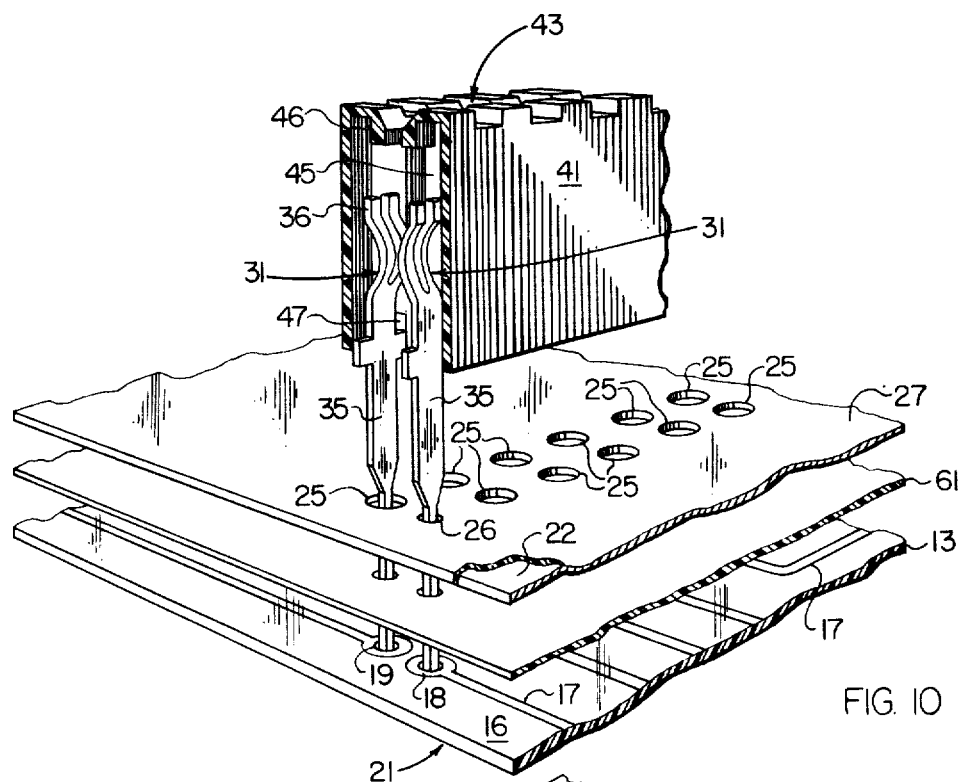
FIG. 10 is an exploded perspective view of a further alternate embodiment of a multi-layer printed circuit board assembly having a metal plate thereon.

Referring to FIG. 10, there is shown another illustrative alternate embodiment of the invention which comprises a stack including a printed circuit board 13, having traces 17 thereon; an optional intermediate layer of insulative material 61; and an upper current carrying plate 22. A plurality of rows of plated-through holes 19, surrounded top and bottom by pads 18 and 21. As described above, the metal plate 22 is preferably first drilled with clearance holes 25, covered with a coating of insulation 27, and then drilled for connecting holes 26.

A pair of rows of contacts 31, having press fitting shank portions 35, and shoulder portions 34, are inserted down through both the clearance holes 25 and the connecting holes 26 into the plated holes 19 in the board 13.

Figure 11:
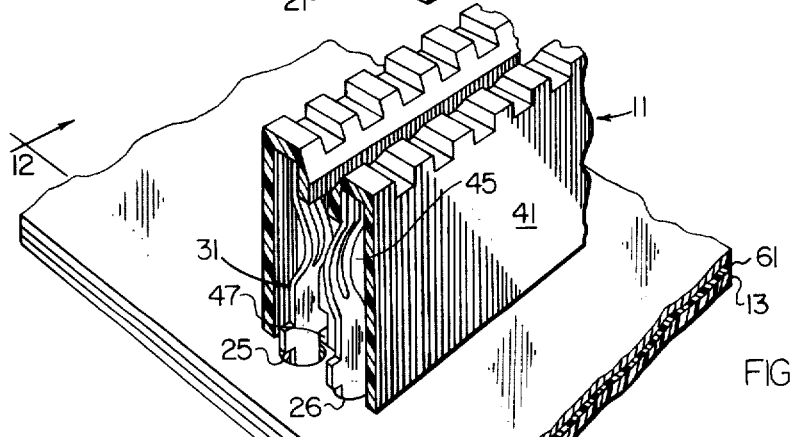
FIG. 11 is a perspective view of the assembled multi-layer structure shown in FIG. 10.

As shown in FIG. 11, the insulative shell 41 is then placed down over the contacts 31 and held thereon by frictional engagement between certain contact shoulders 34 and slots 47 in certain ones of the transverse walls 45. In this configuration, i.e., with the metal plate 22 forming the top layer of the assembly, the forces holding the insulator to the contacts also assist in holding the plate to the underlying layers, such as the printed circuit board 13. Thus, a discrete connector, having press fitting contact portions extending from the bottom of the insulator, can be used to form a multi-layer assembly and hold a top-mounted metal plate in position. Of course, the insulator could not be removed from such a discrete connector to repair any damaged contacts.

Figure 12:
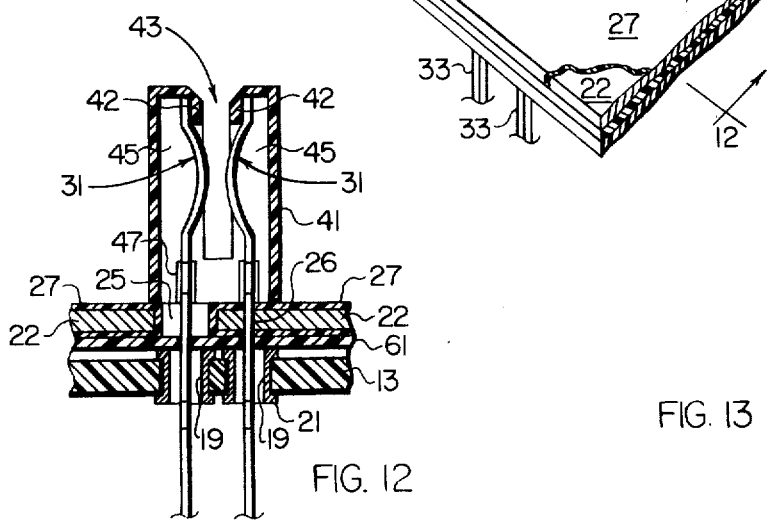
FIG. 12 is a cross-section view taken about the line 12—12 of FIG. 11.

FIG. 12 is a cross-section view taken about the line 12—12 of FIG. 11 and illustrates how the left contact of the pair shown is isolated from the plate 22 by passing through the clearance hole 25. The right contact, on the other hand, is electrically connected to the plate 22 by passing interferingly through the connecting hole 26.

Figure 13:
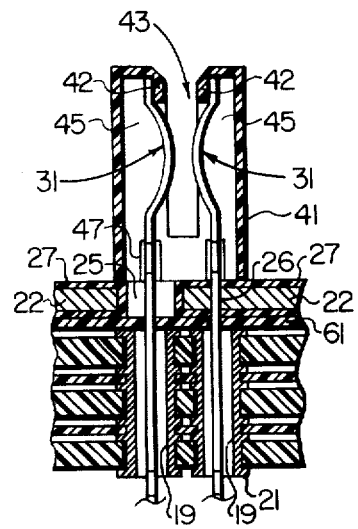
FIG. 13 is a cross-section view of an embodiment of the invention employing a current carrying metal plate and a conventional laminated multi-layer printed circuit board.

The technique of holding the current carrying metal plate by a connector insulator might also be used with a conventional multi-layer printed circuit board. For example, in FIG. 13 there is shown a conventional multi-layer printed circuit board which has been formed by temperature and pressure lamination techniques. The holes therein are formed and plated after lamination so that there is a continuous wall of metal extending from the upper to the lower surface of the board. As in certain other embodiments of the invention, an insulation coated metal plate overlies the upper surface of the board with connecting holes in alignment with certain plated holes and clearance holes in alignment with others. A contact is press fitted through the aligned holes and an insulator laid over. Electrical interconnection between plated holes in the board and the metal plate is accomplished in the same fashion as previously described embodiments. If the current carrying metal plate were affixed to the bottom of a printed circuit board assembly, it could be held securely in place by means such as bolts or rivits.

Having described the invention in connection with certain specific embodiments thereof, it is to be understood that further modifications may now suggest themselves to those skilled in the art and it is intended to cover such modifications as fall within the scope of the appended claims.

What is claimed is:

1. A method for manufacturing a multi-layer printed circuit assembly having a current carrying metal plate formed therein, said method comprising the steps of:
    positioning a top and a bottom printed circuit board each including insulative sheets having patterns of conductive material upon at least one surface thereof and holes in said boards extending through portions of said conductive patterns, said holes being plated with a conductive material which is in electrical contact with the conductive pattern adjacent said holes and said boards being positioned to axially align a plurality of said holes;
    positioning a current carrying metal plate between said top and bottom printed circuit boards, said plate having clearance holes formed therein in axial alignment with certain plated holes in said boards, a coating of insulative material being applied thereover including the interior of said clearance holes and having connecting holes formed therein in axial alignment with certain other plated holes in said boards;
    press fitting a conductive contact having an edge through said aligned plated holes in said circuit boards and said aligned connecting holes in said metal plate with said edge deforming the conductive material within said plated and connecting holes and said contacts being spaced from said metal plate around the insulation coated aligned clearance holes, said contact edges frictionally engaging the conductive material on the walls of said plated holes mechanically joining the individual boards into a single, multi-layer printed circuit board assembly.

2. A method for manufacturing a multi-layer printed circuit assembly having a current carrying metal plate formed therein as set forth in claim 1 wherein, prior to positioning said metal plate between said boards, said method also includes the steps of:
    forming clearance holes in said plate in positions axially aligned with plated holes to be electrically isolated from said metal plate, each of said clearance holes having a diameter greater than that of a plated hole;
    applying an insulative coating to the surfaces of said metal plate having clearance holes therein with said coating also adhering to the inner walls of said clearance holes; and
    forming connecting holes in said plate in positions axially aligned with plated holes to be electrically connected to said metal plate, each of said connecting holes having a diameter about the same as that of a plated hole.

3. A method for manufacturing a printed circuit assembly as set forth in claim 2 wherein the portion of said conductive contacts press fitted into the plated holes includes an angular edge engaging and deforming the conductive material on the walls of said connecting holes in said plate and on the walls of said plated holes to form a tight fit therebetween.

4. A method for manufacturing a printed circuit assembly as set forth in claim 3 wherein the conductive material within said plated holes in said printed circuit boards comprises an inner layer of conductive metal and an outer layer of tin-lead material.

5. A method for manufacturing a printed circuit assembly as set forth in claim 3 wherein the portion of said conductive contacts press fitted into the plated holes is rectangular in cross-section with four angular edges.

6. A method for manufacturing a printed circuit assembly as set forth in claim 1 wherein the metal comprising said current carrying plate is selected from the group consisting of annealed nickel silver and annealed cupro nickel each having a Rockwell hardness of about 85 on the F scale.

7. A method for manufacturing a multi-layer printed circuit board assembly, having a pair of current carrying metal plates formed therein, from a plurality of double sided single layer printed circuit boards each of which includes a sheet of insulative material having a pattern of conductive material formed on both surfaces thereof and a plurality of holes extending through the board which holes extend through portions of both patterns of conductive material, and are plated with a conductive material which is in electrical contact with the portions of conductive patterns adjacent both ends of said holes, which method comprises the steps of:

forming a plurality of clearance holes, greater in diameter than said plated holes, in each of said current carrying plates, each of said clearance holes being located for registration with each of said plated holes which are to be electrically isolated from the plate through which said clearance hole passes;

applying a coating of an insulative dielectric material to the surfaces of each of said plates, including the inside surfaces of each clearance hole formed therethrough;

forming a plurality of connecting holes having a diameter approximately equal to that of said plated holes in each of said coated current carrying plates, each of said connecting holes having an inside surface of bare metal and each being located for registration with each of said plated holes which are to be electrically connected to the plate through which said connecting hole passes;

stacking a plurality of the single layer printed circuit boards and both of the coated, current carrying plates, with at least a top and a bottom printed circuit board having both of said plates therebetween, said boards and said plates being stacked with the holes therein in registration to axially align a plurality of said holes; and press fitting a conductive contact having an edge through the aligned plated holes in said printed circuit boards and the connecting holes in said metal plates with the edge deforming the conductive material within said holes and locking the individual boards and plates into a single, unitary multilayer structure by frictional engagement with the conductive material on the walls of said holes, each of said contacts passing through a connecting hole in a metal plate being in electrical engagement with said plate and each of said contacts passing through a clearance hole in a plate being electrically isolated from said plate.

8. A method for manufacturing a multi-layer printed circuit board assembly as set forth in claim 7 wherein the portion of said conductive contact press fitted into the plated and connecting holes includes an angular edge which engages the conductive material on the walls of said holes to deform the conductive material away from said edge and form a tight fit therewith.

9. A method for manufacturing a multi-layer printed circuit board assembly as set forth in claim 8 wherein the portion of said conductive contact press fitted into the plated and the connecting holes is retangular in cross-section with four angular edges.

10. A method for manufacturing a multi-layer printed circuit board assembly as set forth in claim 7 wherein the metal comprising each of said current carrying plates is selected from the group consisting of annealed nickel silver and annealed cupro nickel each having a Rockwell hardness of about 85 on the F scale.

11. A method for manufacturing a multi-layer printed circuit board assembly, having a pair of current carrying metal plates formed therein, from a plurality of double sided single layer printed circuit boards each of which includes a sheet of insulative material having a pattern of conductive material formed on both surfaces thereof and a plurality of holes extending through the board which holes extend through portions of both patterns of conductive material, and are plated with a conductive material which is in electrical contact with the portions of conductive patterns adjacent both ends of said holes, which method comprises the steps of:

forming a plurality of clearance holes, greater in diameter than said plated holes, in each of said current carrying plates, each of said clearance holes being located for registration with each of said plated holes which are to be electrically isolated from the plate through which said clearance hole passes;

forming a plurality of connecting holes having a diameter approximately equal to that of said plated holes in each of said current carrying plates, each of said connecting holes being located for registration with each of said plated holes which are to be electrically connected to the plate through which said connecting hole passes;

stacking a plurality of the single layer printed circuit boards and both of the current carrying plates after placing a layer of insulation between adjacent ones of said boards and plates, said stack including at least a top and a bottom printed circuit board having both of said plates therebetween and said boards and plates being stacked with the holes therein in registration to axially align a plurality of said holes; and press fitting a conductive contact having an edge through the aligned plated holes in said printed circuit boards and the connecting holes in said metal plates with the edge deforming the conductive material within said holes and locking the individual boards and plates into a single, unitary multilayer structure by frictional engagement with the conductive material on the walls of said holes, each of said contacts passing through a connecting hole in a metal plate being in electrical engagement with said plate and each of said contacts passing through a clearance hole in a plate being electrically isolated from said plate.

12. A method for manufacturing a multi-layer printed circuit board assembly as set forth in claim 11 wherein the portion of said conductive contact press fitted into the plated and connecting holes is rectangular in cross-section with four angular edges.

13. A method for manufacturing a multi-layer printed circuit board assembly as set forth in claim 11 wherein the metal comprising each of said current carrying plates is selected from the group consisting of annealed nickel silver and annealed cupro nickel each having a Rockwell hardness of about 85 on the F scale.

14. A multi-layer printed circuit board assembly having a current carrying metal plate formed therein, comprising:

a stack of single layer printed circuit boards each of which includes a sheet of insulative material having a pattern of conductive material formed on at least one surface thereof and holes extending through the boards which holes extend through portions of the pattern of conductive material, said holes being plated with a conductive material which is in electrical contact with the conductive pattern adjacent said holes and said boards being stacked to align a plurality of said holes;

a current carrying metal plate positioned between a top and a bottom printed circuit board in said stack, said plate having clearance holes formed therein in axial alignment with certain plated holes in said boards, a coating of insulative material covering both surfaces of said plate and the insides of the clearance holes, and connecting holes formed therein in axial alignment with certain other plated holes in said boards, said connecting holes having bare metal inner walls; and a conductive contact having an edge press fitted through each of said axially aligned plated holes in said circuit boards and said aligned connecting holes in said metal plate with said edge deforming the conductive material within said plated and connecting holes and said contacts being spaced from said metal plate around the insulation coated aligned clearance holes, said contact edges frictionally engaging the conductive material on the walls of said plated holes mechanically joining the individual boards and plate into a single, multi-layer printed circuit board assembly.

15. A multi-layer printed circuit board assembly as set forth in claim 14 wherein the portion of said conductive contacts press fitted into the plated and connecting holes includes an angular edge which engages the conductive material on the walls of said holes to deform the conductive material away from said edge and form a tight fit therewith.

16. A multi-layer printed circuit board assembly as set forth in claim 15 wherein the portion of said conductive contacts press fitted into the plated holes is rectangular in cross-section with four angular edges.

17. A multi-layer printed circuit board assembly as set forth in claim 14 wherein the metal comprising said current carrying plate is selected from the group consisting of annealed nickel silver and annealed cupro nickel each having a Rockwell hardness of about 85 on the F scale.

18. A multi-layer printed circuit board assembly, having a pair of current carrying metal plates formed therein, said assembly comprising:
- a stack of single layer printed circuit boards, including a top and a bottom board, each board of which includes a sheet of insulative material having a pattern of conductive material formed on at least one surface thereof and holes extending through the boards which holes extend through portions of the pattern of conductive material, said holes being plates with a conductive material which is in electrical contact with the conductive pattern adjacent said holes and said boards being stacked to align a plurality of said holes;
- a pair of current carrying metal plates positioned between said top and bottom boards in said stack, each of said plates having clearance holes formed therein in axial alignment with certain plated holes in said boards and connecting holes formed therein in axial alignment with certain other plated holes in said boards, said connecting holes being approximately the same size as said plated holes in said boards and said clearance holes being substantially larger than said plated holes;
- a layer of insulative material between contiguous surfaces of said stack of boards and plates; and
- a conductive contact having an edge press fitted through each of said axially aligned plated holes in said circuit boards and said aligned connecting holes in said metal plates with said edge deforming the conductive material within said plated and connecting holes and said contacts being spaced from said metal plate around the aligned clearance holes, said contact edges frictionally engaging the conductive material on the walls of said plated holes mechanically joining the individual boards and plates into a single, multi-layer printed circuit board assembly.

19. A multi-layer printed circuit board assembly as set forth in claim 18 wherein each of said layers of insulative material comprise sheets of insulation.

20. A multi-layer printed circuit board assembly as set forth in claim 18 wherein said layers of insulation include a coating of insulative material applied to each of said metal plates including the areas within said clearance holes and excluding areas within said connecting holes.

21. A multi-layer printed circuit board assembly as set forth in claim 18 wherein the metal comprising each of said current carrying plates is selected from the group consisting of annealed nickel silver and annealed cupro nickel each having a Rocowell hardness of about 85 on the F scale.

22. A multi-layer assembly comprising:
- at least one printed circuit board which includes a sheet of insulative material having a pattern of conductive material formed on at least one surface thereof and holes extending through the board which holes extend through portions of the pattern of conductive material, said holes being plated with a conductive material which is in electrical contact with the conductive pattern adjacent said holes;
- at least one current carrying metal plate positioned adjacent said printed circuit board, said plate having clearance holes formed therein in axial alignment with certain plated holes in said board, a coating of insulative material covering both surfaces of said plate and the insides of the clearance holes, and connecting holes formed therein in axial alignment with certain other plated holes in said boards, said connecting holes having bare metal inner walls; and
- a conductive contact having an edge press fitted through each of said axially aligned plated holes in said circuit board and said aligned connecting holes in said metal plate with said edge deforming the conductive material within said plated and connecting holes and said contacts being spaced from said metal plate around the insulation coated aligned clearance holes, said contact edges frictionally engaging the conductive material on the walls of said plated holes mechanically joining the board and plate into a single multi-layer assembly.

23. A multi-layer assembly as set forth in claim 22 wherein the portion of said conductive contacts press fitted into the plated and connecting holes includes an angular edge which engages the conductive material on the walls of said holes to deform the conductive material away from said edge and form a tight fit therewith.

24. A multi-layer assembly as set forth in claim 23 wherein the portion of said conductive contacts press fitted into the plated holes is rectangular in cross-section with four angular edges.

25. A multi-layer assembly as set forth in claim 22 wherein the metal comprising said current carrying plate is selected from the group consisting of annealed nickel silver and annealed cupro nickel each having a Rockwell hardness of about 85 on the F scale.

26. A mutli-layer assembly as set forth in claim 22 wherein said printed circuit board comprises a conventional laminated printed circuit board having continuously plated holes from the upper to the lower board surface.

27. A multi-layer printed circuit board assembly, having a pair of current carrying metal plates formed therein comprising:
- a plurality of double-sided single layer printed circuit boards each of which includes a sheet of insulative material having a pattern of conductive material formed on both surfaces thereof and a plurality of holes extending through the board which holes extend through portions of both patterns of conductive material and are plated with a conductive material which is in electrical contact with the portions of conductive patterns adjacent both ends of said holes;
- a pair of current carrying metal plates each of which having a plurality of clearance holes, greater in diameter than said plated holes, each of said clearance holes being located for registration with each of said plated holes which are to be electrically isolated from the plate through which said clearance hole passes, said printed circuit boards and said current carrying metal plates being stacked with at least a top and a bottom printed circuit board having both of said plates therebetween with the respective holes therein in registration to axially align a plurality of said holes;
- a coating of an insulative, dielectric material covering the surfaces of each of said plates, including the inside surfaces of each clearance hole formed therethrough;
- a plurality of connecting holes in each of said coated current carrying plates, each of said connecting holes having a diameter approximately equal to that of said plated holes in each of said printed circuit boards, each of said connecting holes also having an inside surface of bare metal and each being located for registration with each of said plated holes which are to be electrically connected to the plate through which said connecting hole passes; and
- a conductive contact having an edge press fitted through the aligned plated holes in said printed circuit boards and the connecting holes in said metal plates with the edge deforming the conductive material within said holes and locking the individual boards and plates into a single, unitary multi-layer structure by frictional engagement with the conductive material on the walls of said holes, each of said contacts passing through a connecting hole in a metal plate being in electrical engagement with said plate and each of said contacts passing through a clearance hole in a plate being electrically isolated from said plate.

28. An assembly as set forth in claim 27 wherein the portion of each of said conductive contacts press fitted into the plated and connecting holes includes an angular edge which engages the conductive material on the walls of said holes to deform the conductive material away from said edge and form a tight fit therewith.

29. A multi-layer printed circuit board assembly as set forth in claim 28 wherein the portion of said conductive contact press fitted into the plated and the connecting holes is rectangular in cross-section with four angular edges.

30. A multi-layer printed circuit board assembly as set forth in claim 27 wherein the metal comprising each of said current carrying plates is selected from the group consisting of annealed nickel silver and annealed cupro nickel each having a Rockwell hardness of about 85 on the F scale.

31. A multi-layer printed circuit board assembly as set forth in claim 27 wherein one of said pair of current carrying metal plates is formed in a plurality of strips, each strip lying in the same plane as the others but being electrically insulated therefrom to permit each strip to be maintained at a separate voltage from the other strips joining said plate.

32. A multi-layer assembly comprising:
- a single layer printed circuit board including a sheet of insulative material having a pattern of conductive material formed on at least one surface thereof and holes extending through the board which holes extend through portions of the pattern of conductive material, said holes being plated with a conductive material which is in electrical contact with the conductive pattern adjacent said holes and said boards being stacked to align a plurality of said holes;
- a current carrying metal plate positioned adjacent the upper surface of said printed circuit board, said plate having clearance holes formed therein in axial alignment with certain plated holes in said board, a coating of insulative material covering both surfaces of said plate and the insides of the clearance holes, and connecting holes formed therein in axial alignment with certain other plated holes in said boards, said connecting holes having bare metal inner walls;
- a conductive contact having an edge press fitted through each of said axially aligned plated holes in said circuit boards and said aligned connecting holes in said metal plate with said edge deforming the conductive material within said plated and connecting holes and said contacts being spaced from said metal plate around the insulation coated aligned clearance holes, said contact edges frictionally engaging the conductive material on the walls of said plated holes, said contacts being arranged in a plurality of rows and each having a connecting portion protruding above the surface of said plate; and
- an insulative housing being placed over the protruding connecting portions of at least one row of said contacts, said housing being held in position by frictional engagement with a portion of certain of said contacts, the lower edge of said housing serving to mechanically join said board and said plate into single multi-layer assembly.

33. A multi-layer assembly as set forth in claim 32 wherein the portion of said conductive contacts press fitted into the plated and connecting holes includes an angular edge which engages the conductive material on the walls of said holes to deform the conductive material away from said edge and form a tight fit therewith.

34. A multi-layer assembly as set forth in claim 33 wherein the portion of said conductive contacts press fitted into the plated holes is rectangular in cross-section with four angular edges.

35. A multi-layer assembly as set forth in claim 33 wherein the metal comprising said current carrying plate is selected from the group consisting of annealed nickel silver and annealed cupro nickel each having a Rockwell hardness of about 85 on the F scale.

36. A multi-layer assembly as set forth in claim 32 wherein said insulative housing includes an opening in the top thereof to receive a printed circuit card having conductive areas thereon which conductively engage the contact portions within said housing.

37. A method for manufacturing a multi-layer assembly having at least one current carrying metal plate and one printed circuit board which board includes a sheet of insulative material having a pattern of conductive material formed thereon and a plurality of holes extending through the board which holes extend through a portion of said pattern of conductive material and are plated with a conductive material which is in electrical contact with a portion of said pattern, which method comprises the steps of:

forming a plurality of clearance holes, greater in diameter than said plated holes, in said current carrying plate, each of said clearance holes being located for registration with the plated holes in said boards which are to be electrically isolated from the plate through which said clearance hole passes;

applying a coating of an insulative, dielectric material to the surface of said plate, including the inside surfaces of each clearance hole formed therethrough;

forming a plurality of connecting holes, having a diameter approximately equal to that of said plated holes, in said coated current carrying plates, each of said connecting holes having an inside surface of bare metal and each being located for registration with each of said plated holes which are to be electrically connected to the plate through which said connecting hole passes;

stacking said plate and said board with the holes therein in registration to axially align a plurality of said holes; and press fitting a conductive contact having an edge through the aligned plated holes in said printed circuit board and the connecting holes in said metal plate with the edge deforming the conductive material within said holes and locking said board and plate into a single, unitary multi-layer assembly by frictional engagement with the conductive material on the walls of said holes, each of said contacts passing through a connecting hole in said metal plate being in electrical engagement with said plate and each of said contacts passing through a clearance hole in a plate being electrically isolated from said plate.

38. A method for manufacturing a multi-layer assembly as set forth in claim 37 wherein the portion of said conductive contact press fitted into the plated and connecting holes includes an angular edge which engages the conductive material on the walls of said holes to deform the conductive material away from said edge and form a tight fit therewith.

39. A method for manufacturing a multi-layer assembly as set forth in claim 37 wherein the metal comprising said current carrying metal plate is selected from the group consisting of annealed nickel silver and annealed cupro nickel each having a Rockwell hardness of about 85 on the F scale.

* * * * *